United States Patent
Gogoi et al.

(10) Patent No.: US 7,585,744 B2
(45) Date of Patent: Sep. 8, 2009

(54) METHOD OF FORMING A SEAL FOR A SEMICONDUCTOR DEVICE

(75) Inventors: Bishnu P. Gogoi, Scottsdale, AZ (US); Raymond M. Roop, Scottsdale, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 311 days.

(21) Appl. No.: 10/730,230

(22) Filed: Dec. 8, 2003

(65) Prior Publication Data

US 2005/0124089 A1 Jun. 9, 2005

(51) Int. Cl.
*H01L 21/76* (2006.01)

(52) U.S. Cl. .......... 438/422; 438/421; 438/424; 257/E23.013; 257/E21.573; 257/E21.581

(58) Field of Classification Search ............ 438/424, 438/637, 638, 421, 422; 257/E21.579, E23.013, 257/E21.573, E21.581
See application file for complete search history.

(56) References Cited

U.S. PATENT DOCUMENTS

| | | | | |
|---|---|---|---|---|
| 5,208,180 | A * | 5/1993 | Gonzalez | 438/387 |
| 5,576,250 | A * | 11/1996 | Diem et al. | 438/50 |
| 5,798,283 | A * | 8/1998 | Montague et al. | 438/24 |
| 5,869,406 | A * | 2/1999 | Su et al. | 438/789 |
| 5,911,109 | A * | 6/1999 | Razouk et al. | 438/424 |
| 6,013,584 | A * | 1/2000 | M'Saad | 438/783 |
| 6,413,793 | B1 * | 7/2002 | Lin et al. | 438/50 |
| 6,617,657 | B1 * | 9/2003 | Yao et al. | 257/415 |
| 6,629,425 | B2 * | 10/2003 | Vaiyapuri | 62/259.2 |
| 6,635,509 | B1 | 10/2003 | Ouellet | |
| 6,936,491 | B2 * | 8/2005 | Partridge et al. | 438/48 |
| 7,098,065 | B2 * | 8/2006 | Chiu et al. | 438/51 |
| 2002/0016058 | A1 * | 2/2002 | Zhao | 438/619 |
| 2002/0098611 | A1 * | 7/2002 | Chang et al. | 438/50 |
| 2002/0182819 | A1 * | 12/2002 | Schrems et al. | 438/386 |
| 2004/0058476 | A1 * | 3/2004 | Enquist et al. | 438/114 |
| 2004/0119125 | A1 * | 6/2004 | Gogoi et al. | 257/414 |
| 2004/0180465 | A1 * | 9/2004 | Musolf et al. | 438/52 |
| 2005/0023629 | A1 * | 2/2005 | Ding et al. | 257/414 |

(Continued)

OTHER PUBLICATIONS

Sze, S.M., "VLSI Technology", 1988 by Bell Telephone Laboratories, Inc., McGraw-Hill, pp. 355-362.*

(Continued)

*Primary Examiner*—Michelle Estrada
(74) *Attorney, Agent, or Firm*—Kim-Marie Vo

(57) ABSTRACT

In one embodiment, a reflowable layer 51 is deposited over a semiconductor device 10 and reflowed in an environment having a pressure approximately equal to that of atmosphere to form a seal layer 52. The seal layer 52 seals all openings 43 in the underlying layer of the semiconductor device 10. Since the reflow is performed at approximately atmospheric pressure a gap 50 which was coupled to the opening 43 is sealed at approximately atmospheric pressure, which is desirable for the semiconductor device 10 to avoid oscillation. The seal layer 52 is also desirable because it prevents particles from entering the gap 50. In another embodiment, the seal layer 52 is deposited in an environment having a pressure approximately equal to atmospheric pressure to seal the hole 43 without a reflow being performed.

20 Claims, 8 Drawing Sheets

U.S. PATENT DOCUMENTS

2007/0138584 A1* 6/2007 Fortin et al. .................. 257/419
2007/0298534 A1* 12/2007 Ikushima et al. .............. 438/57

OTHER PUBLICATIONS

Burns et al., "Sealed-cavity Resonant Microbeam Accelerometer," Sensors and Actuators 1 53 (1996), pp. 249-255.

Lin et al., "Microelectromechanical Filters for Signal Processing," IEEE Journal Of Microelectromechanical Systems, vol. 7, No. 3, Sep. 1998, pp. 286-294.
Gogoi et al., "A Low-Voltage Force-Balanced Pressure Sensor With Hermetically Sealed Servomechanism," IEEE 1999, pp. 493-498.
U.S. Appl. No. 10/328,923, filed Dec. 23, 2002.
U.S. Appl. No. 10/328,922, filed Dec. 23, 2002.

* cited by examiner

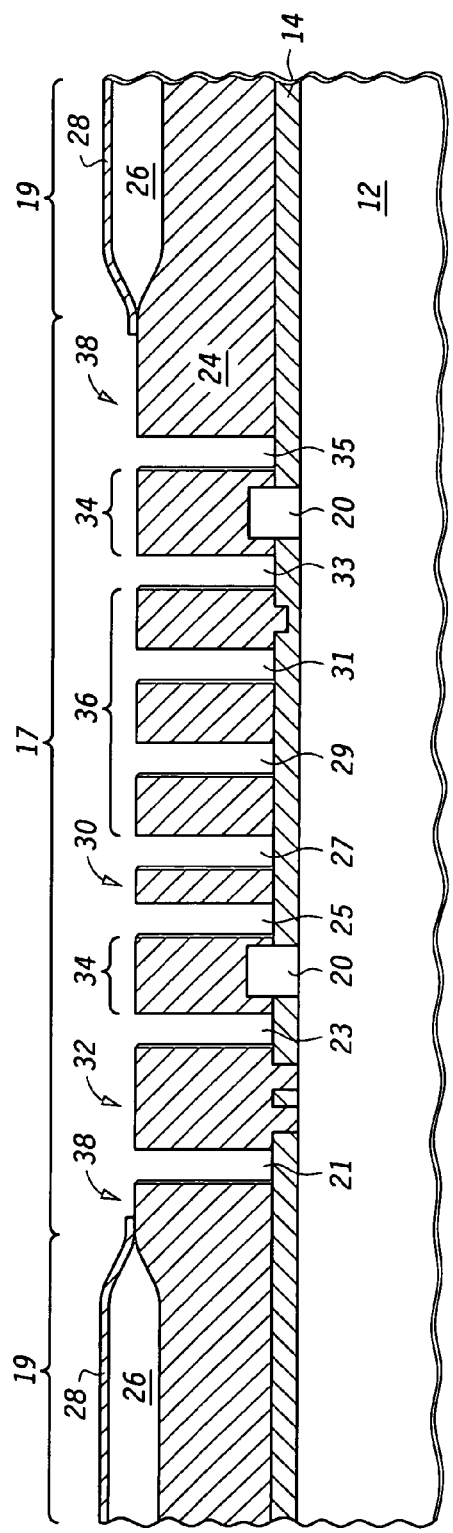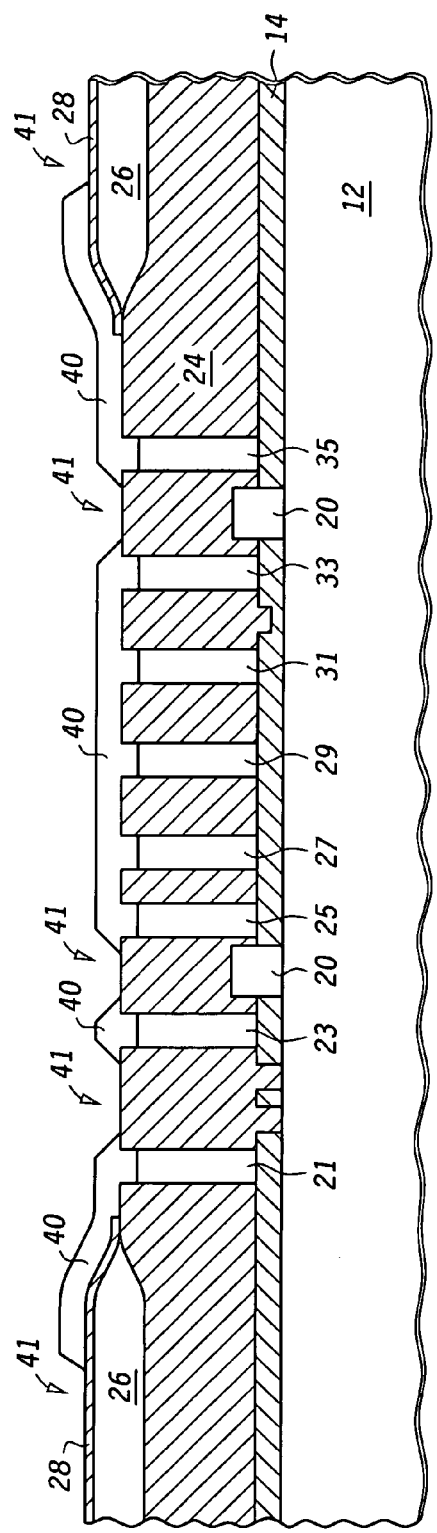

METHOD OF FORMING A SEAL FOR A SEMICONDUCTOR DEVICE

FIELD OF THE INVENTION

This invention relates generally to semiconductor devices, and more specifically, to microelectromechanical systems (MEMS) devices.

BACKGROUND

MEMS devices, i.e., miniature devices the size of an integrated circuit, have been introduced into a wide variety of consumer and industrial products that require small devices. One such use of a MEMS device is an accelerometer used in automobiles to detect a car accident. Upon such detection, an air bag may be deployed. The MEMs device has two main portions: 1) a stationary portion; and 2) a movable portion suspended by a spring (i.e., a flexible material) that is coupled to the stationary portion by an anchor. The stationary portion and the movable portion have each have fingers (protrusions) which are interdigitated among each other. In other words, each finger of the stationary portion is surrounded by a finger of the movable portion and separated by a gap. When the car decelerates, for example, from 60 miles per hour (mph) to 0 mph, the gaps between the fingers changes. The change in the gap width is detected by measuring the capacitance between the gaps. Upon a change in capacitance or capacitance threshold being met an action, such as airbag deployment, occurs.

Typically, the gaps are approximately 1-2 microns in width. If any particles are introduced into the gaps the accelerometer will not function properly. One solution to keep particles out of the gaps of the accelerometer is to put a cap wafer on top of the accelerometer. This can be performed by gluing a cap wafer using a glass frit layer over the gaps. One problem with this approach is that it results in a large die size for the accelerometer.

Another approach is to form a layer to seal the gap using plasma enhanced chemical vapor deposition (PECVD) or low pressure chemical vapor deposition (LPCVD). However, both PECVD and LPCVD are performed in vacuum environments and will result in the gap being at vacuum. When the gap's pressure is at vacuum the accelerometer is underdamped and oscillates. This is undesirable because it decreases the performance of the accelerometer. Therefore, a need exists for preventing particles from entering the gap while not underdamping the oscillator.

BRIEF DESCRIPTION OF THE DRAWINGS

The present invention is illustrated by way of example and is not limited by the accompanying figures, in which like references indicate similar elements.

FIG. 5 illustrates the semiconductor device of FIG. 4 after defining spring suspension, seismic mass, anchor, fixed electrodes and field areas in accordance with an embodiment of the present invention;

FIG. 6 illustrates the semiconductor device of FIG. 5 after forming a first sacrificial layer in accordance with an embodiment of the present invention;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
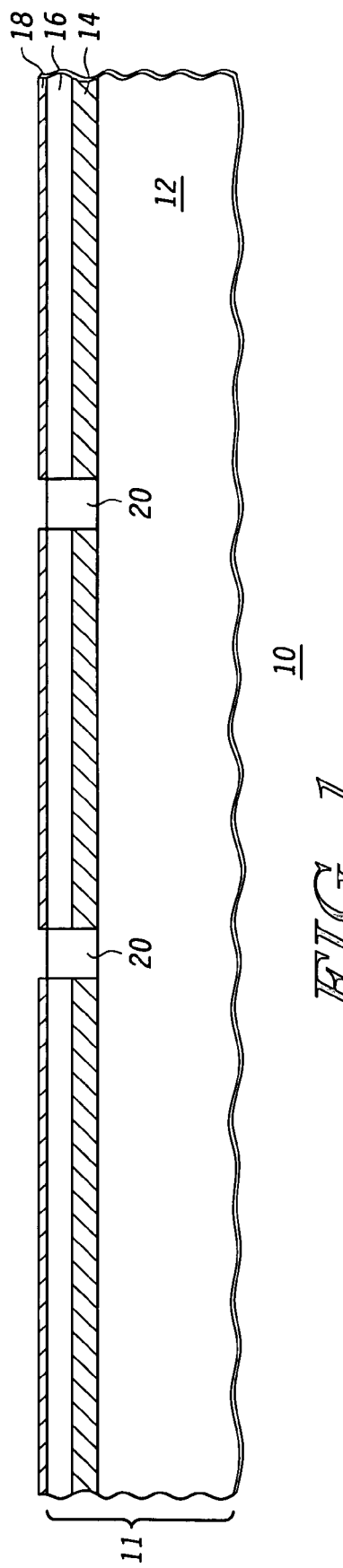
FIG. 1 illustrates a cross section of a portion of a semiconductor device having anchors in accordance with an embodiment of the present invention.

As shown in FIG. 1, a semiconductor device 10, such as an accelerometer or other MEMS device, includes a semiconductor layer 12, a buried oxide (BOX) layer 14, a (semiconductor) active layer 16, a (screen) oxide layer 18 and anchors 20. In one embodiment, the semiconductor layer 12 is n-type monocrystalline silicon and is n-type, the BOX layer 14 is approximately 2 microns of silicon dioxide, and the active layer 16 is approximately 0.4 microns of monocrystalline silicon. In one embodiment, the semiconductor layer 12, the BOX layer 18 and the active layer 16 form a silicon-on-insulator substrate 11. The semiconductor layer and the active layer can be any semiconductor material or combinations of materials, such as gallium arsenide, silicon germanium, silicon, monocrystalline silicon and the like and the BOX layer 14 can be any insulating material. In one embodiment, the BOX layer 14 is a sacrificial layer. Formed over the active layer 16, the screen oxide layer 18 is used as an etch stop layer during the formation of the anchors 20. In one embodiment the screen oxide layer 18 is approximately 0.12 microns in thickness of silicon dioxide; however, other oxides and thicknesses can be used.

In one embodiment the anchors 20 are a nitride, such as silicon nitride. In one embodiment approximately 0.8 microns of silicon nitride is deposited using low pressure chemical vapor deposition (LPCVD) over the semiconductor device 10. After deposition, the silicon nitride is etched back using the screen oxide layer 18 as an etch stop layer resulting in the silicon nitride formed on the screen oxide layer 18 being removed and the anchor 20 being recessed with respect to the screen oxide layer 18 and being approximately coplanar with the top of the active layer 16. In one embodiment, hydrofluoric acid (HF) is used to etch back the silicon nitride to form the anchors 20.

Figure 2:
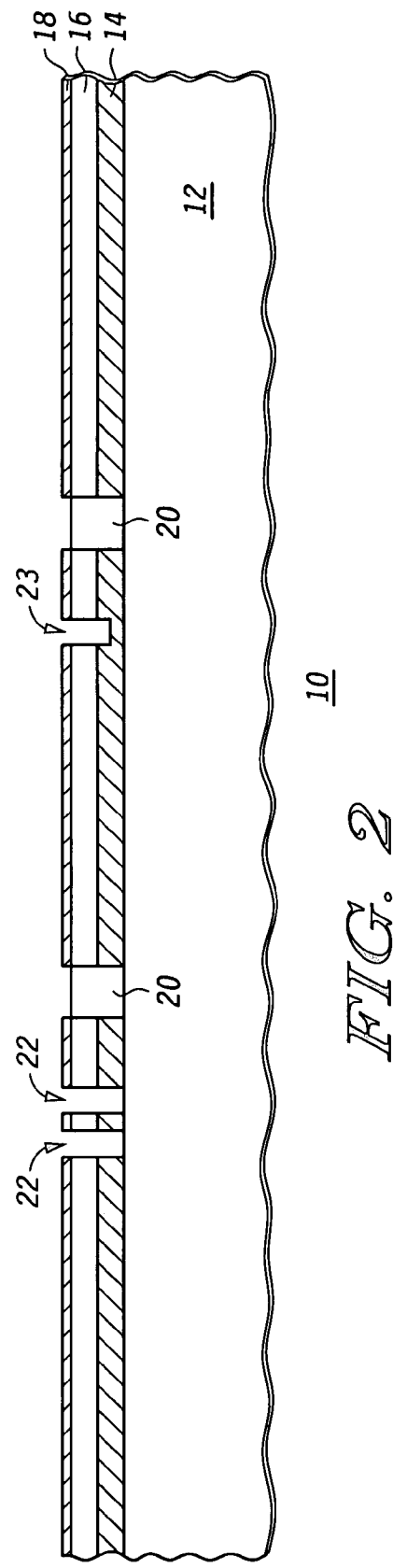
FIG. 2 illustrates the semiconductor device of FIG. 1 after dimple and bulk contact formation in accordance with an embodiment of the present invention.

As illustrated in FIG. 2, a dimple 23 and bulk contact openings 22 are formed in layers 14, 16 and 18 to expose the semiconductor layer 12. (Additional dimples and bulk contacts than those shown in the figures could be formed.) In one embodiment the dimples are approximately 1-2 microns in width. To form the bulk contact openings 22, the screen oxide 18, the active layer 16 and the BOX layer 14 are completely etched through. In contrast, when forming the dimple 23 the screen oxide 18 and the active layer 16 are etched completely through, but the BOX layer 14 is only partially etched. For example, to form the dimple 23 in an embodiment where the BOX layer 14 is approximately 2 microns a time etch can be used to remove approximately 0.5 microns of the BOX layer 14. Thus, when forming the dimples 23 a timed etch is desirable (but not required) to stop within the BOX layer 14 and when forming the bulk contact openings 22 the semiconductor layer 12 can be used as an etch stop layer.

The dimple 23 is formed to prevent subsequently formed features, such as the seismic mass, from coming into contact with the semiconductor substrate and thereby prevents stiction. Stiction is a mode of failure that occurs when two surfaces come into contact and are held together by surface forces. This prevents any moving elements from moving in the semiconductor device 10. In addition, the dimples may stop motion in the z-direction (i.e., the direction perpendicular to the ground) when the semiconductor device 10 is exposed to a high acceleration. The bulk contact openings 22 (when filled with an appropriate material) will electrically coupled to the semiconductor substrate 10 to prevent the semiconductor layer 12 from being at a floating potential and thus it enables the substrate to be at a fixed potential. In addition, the bulk contact openings 22 (when filled with an appropriate material) will enable formation of an electromagnetic shield below subsequently formed layers.

Figure 3:
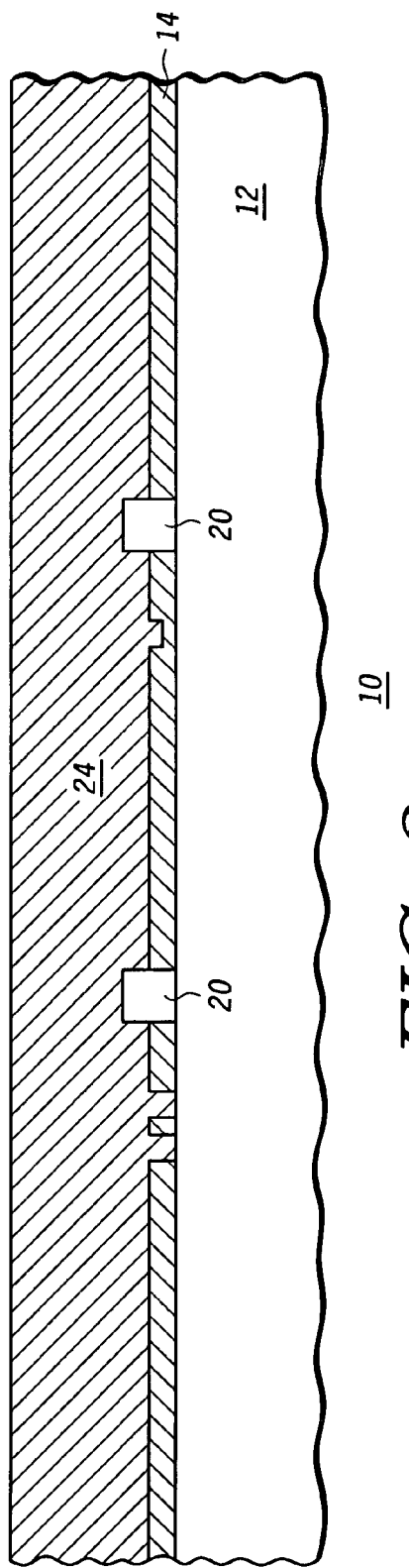
FIG. 3 illustrates the semiconductor device of FIG. 2 after an epitaxial layer is formed in accordance with an embodiment of the present invention.

After forming the dimple 23, the screen oxide 18 is removed by etching. Next, an epitaxial semiconductor layer 24, such as silicon, is grown from the semiconductor layer 12 through the bulk contacts 23 and from the active layer 16, as shown in FIG. 3. Since the active layer 16 and the epitaxial semiconductor layer 24 are the same materials, they combine together to form the epitaxial semiconductor layer 24. In other words, the active layer 16 is the seed layer for the epitaxial growth of the epitaxial semiconductor layer 24. The epitaxial semiconductor layer 24 is grown to a required thickness of an accelerometer. In one embodiment, the epitaxial semiconductor layer 24 is approximately 25 microns thick and is n-type silicon doped with phosphorus. The epitaxial semiconductor layer 24 is laterally grown over the dimple 23 in the BOX layer 14 due to the dimple 23 being a small feature even though the epitaxial growth is a selective process does not occur on the BOX layer 14. In addition, the epitaxial semiconductor layer 24 is formed over the anchors 20 and in the bulk contact openings 22. So that the epitaxial semiconductor layer 24 grows in the dimples 23 and the over the anchors 20 the process conduction are chosen (as know to a skilled artisan) to render the process non-selective epitaxial growth. In on embodiment, lateral growth of the epitaxial semiconductor layers 24 occurs through epitaxial lateral overgrowth (ELO).

Figure 4:
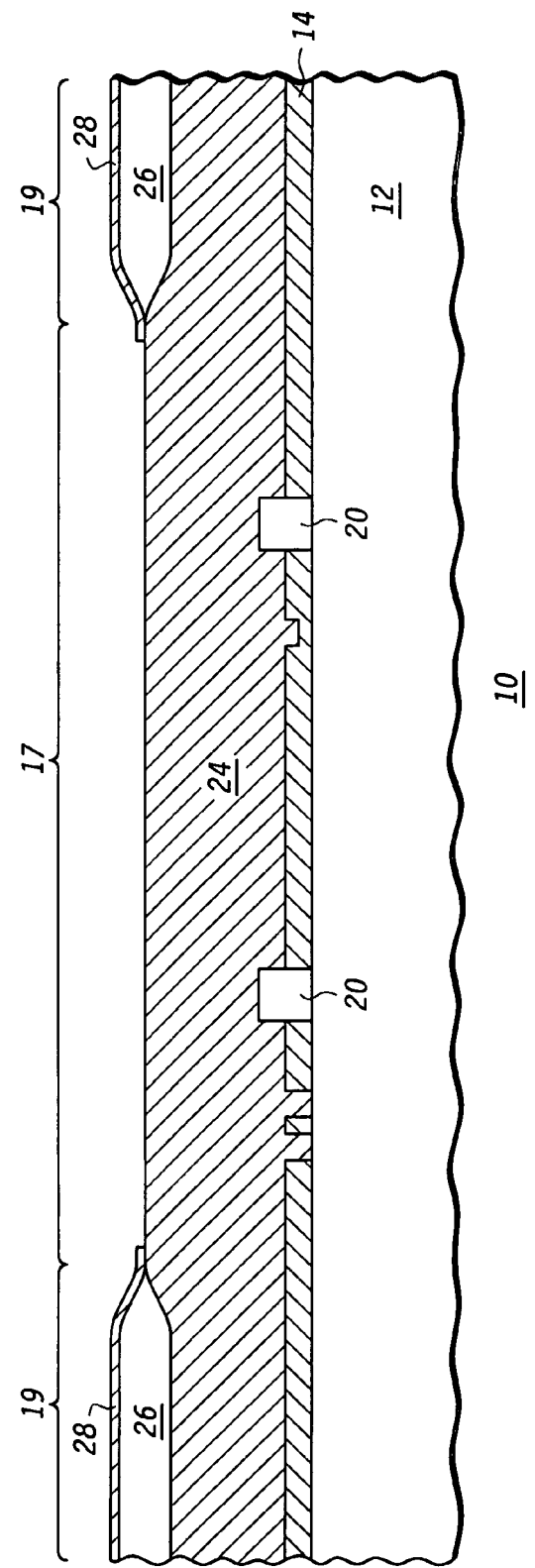
FIG. 4 illustrates the semiconductor device of FIG. 3 after forming isolation regions and a first isolation layer in accordance with an embodiment of the present invention.

After forming the epitaxial semiconductor layer 24, isolation regions 26 are formed to define an active area 17 of the semiconductor device 10, which lies between field areas 19, as shown in FIG. 4. The isolation regions 26 are within field areas 19. In the embodiment shown the isolation regions are formed using a LOCOS process as known to a skilled artisan; however, a shallow trench isolation process may also be used. It is desirable that the isolation regions 26 are thick (e.g., approximately 2-2.5 microns) to reduce parasitic capacitance of the active area 17. If LOCOS is used, it is desirable that the slope of the bird's beak should be low so that resist layers used for patterning in subsequent processing have good step coverage. In addition, the distance from the isolation regions 26 to the active area 17 should be large enough to prevent attack of the isolation regions 26 during a subsequently formed release; in one embodiment, the distance is approximately 5 to 20 microns. Furthermore, after the formation of the isolation regions 26 the semiconductor device 10 should not have excessive bow; in one embodiment, the bow is less than approximately 100 microns. In one embodiment, the oxide thermally grown to form the isolation regions 26 is approximately 0.05 microns.

Next, a first isolation nitride (layer) 28 is deposited and patterned to remain over the isolation regions 26, as shown in FIG. 4, to protect the isolation regions 26 from the chemistry used during the release etch. In one embodiment, the first isolation nitride 28 is approximately 0.5 microns of a low stress silicon rich silicon nitride formed by LPCVD. In one embodiment, the low stress silicon rich silicon nitride has a tensile stress less than approximately 200 MPa. The first isolation nitride 28 should have a high selectively to the BOX layer 14, such 50:1 in an HF etch chemistry, for example. The patterning can be formed using conventional processing (resist layers and an etch, such as reactive ion etching.) As shown in FIG. 4, some of the first isolation nitride 28 may be formed over a portion of the active area 17. In one embodiment, the overlap is approximately 10 microns by design but may vary due to processing.

As illustrated in FIG. 5, after patterning the first isolation nitride 28, a patterning process is performed to form trenches 21, 23, 25, 27, 29, 31, 33 and 35 in the epitaxial semiconductor layer 24. In one embodiment, the patterning is performed by a deep reactive ion etch (DRIE) resulting in the trenchs' widths being approximately 1.8 to 2 microns, the minimum notching at the bottom of the trench being approximately 0 to 0.2 microns and the vertical sidewall of the trenches being approximately 89-90 degrees with respect to the semiconductor substrate 12. The DRIE, in one embodiment, etches down approximately 25 microns using the BOX layer 14 as an etch stop layer. By forming the trenches 21, 23, 25, 27, 29, 31, 33 and 35, fixed electrodes 34, suspension 30, bulk (substrate) contact 32, and seismic mass 36 are defined in the active area 17. Field regions 38 are also defined in the field areas 19. The seismic mass 36 moves with acceleration when present, the spring suspension 30 provides a flexible connection to the seismic mass 36. The bulk contact 32 fills the bulk contact openings 22 and prevent the semiconductor layer 12 from being at a floating potential and thus it enables the substrate to be at a fixed potential. In addition, the bulk 32 enables formation of an electromagnetic shield below subsequently formed layers.

After defining the fixed electrodes 34, the suspension 30, and the seismic mass 36, a first sacrificial layer 40 is formed and patterned over the semiconductor device 10, as shown in FIG. 6. The first sacrificial layer 40 seals the trenches 21, 23, 25, 27, 29, 31, 33 and 35 by covering up the openings of the trenches 21,23, 25, 27, 29, 31, 33, and 35 and creates a top planar surface in the active area 17. The first sacrificial layer 40 may fill the trenches 21, 23, 25, 27, 29, 31, 33, and 35 completely or partially depending on the conformality of the process used to form the first sacrificial layer 40, especially when phosphosilicate glass (PSG) is used as the first sacrificial layer 40 and formed using PECVD. In one embodiment, the trenches 21, 23, 25, 27, 29, 31, 33, and 35 are be filled with a key hold void but would be planar on the top surface of the trenches 21, 23, 25, 27, 29, 31, 33, and 35. The material chosen for the sacrificial layer 40 should be able to withstand subsequent high temperature processing and be able to be removed without removing the layers which are to remain, as will be explained in more detail below. In one embodiment, the sacrificial layer 40 is of PSG. In one embodiment, PSG is deposited using PECVD and is annealed in an N2, O2, or combination of the above environment to seal the top of the trenches 21, 23, 25, 27, 29, 31, 33, and 35.

The patterning of the first sacrificial layer 40 forms first openings 41 which expose portions of the first insulation nitride 28, the fixed electrodes 34 so that subsequently formed bridges are coupled to the fixed electrodes 34. The first sacrificial layer 40 may be patterned using a resist layer and a wet etch, dry etch, or a combination of the above.

Figure 7:
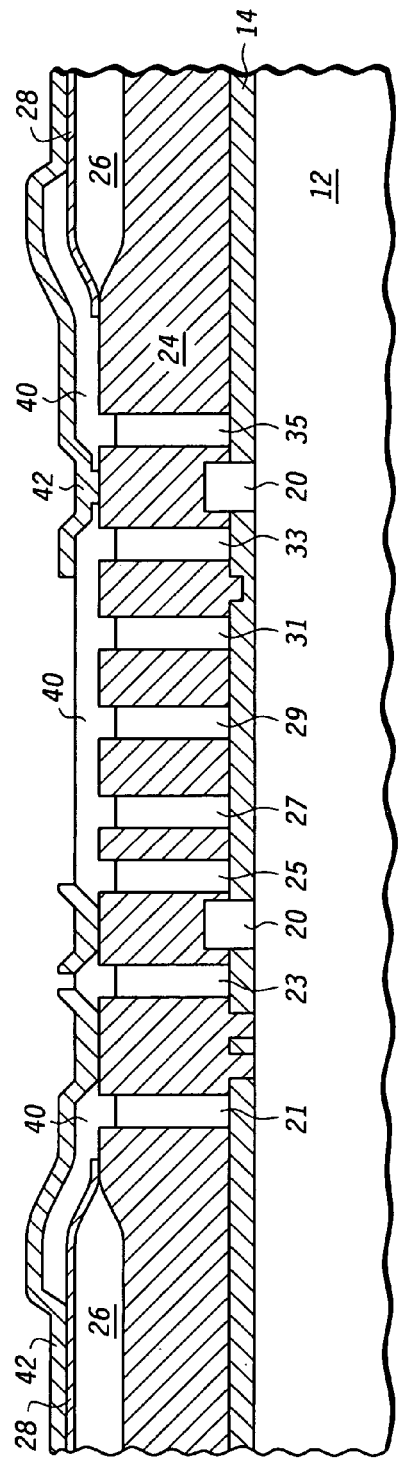
FIG. 7 illustrates the semiconductor device of FIG. 6 after forming bridges in accordance with an embodiment of the present invention.

As illustrated in FIG. 7, bridges 42 are formed over the semiconductor device 10. The bridges 42 couple the active area 17 to the field areas 19 and to bond pads (to be formed later) and thus are conductive. Any suitable material can be used that preferably has a low contact resistance (e.g., doped polysilicon with a contact resistance of approximately 20-40 Ohms/square), has good adhesion with the active area 17, is not etched during a subsequently formed release etch, have low sheet resistance (e.g., doped polysilicon with a sheet resistance of approximately 20-50 Ohms/square), has sufficient mechanical strength to serve as the bridges after the release etch, and is able to withstand mechanical shocks. In one embodiment, the bridges 42 are formed of polysilicon using the following processes. First, a clean process using HF may be performed to remove any native oxide from the exposed portions of the fixed electrodes 34. Next, approximately two microns of polysilicon is deposited using LPCVD so that it is compressive. The polysilicon layer 42 is patterned by etching using phosphorus. The polysilicon layer 42 is then etched using conventional processing using the first sacrificial layer 40 and the first isolation nitride 28 as etch stop layers.

Figure 8:
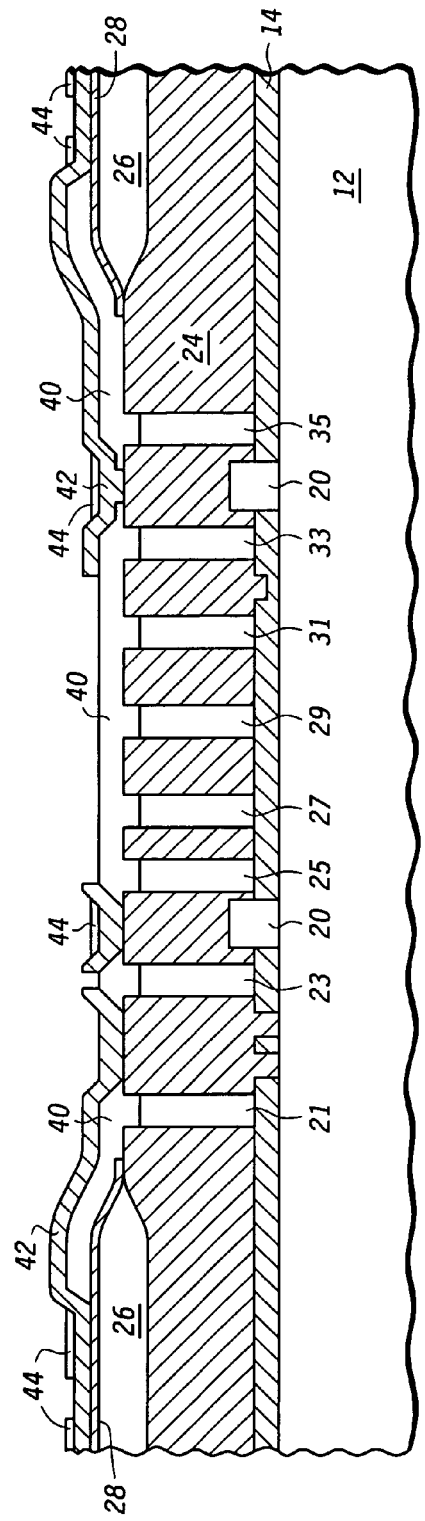
FIG. 8 illustrates the semiconductor device of FIG. 7 after forming a second isolation layer in accordance with an embodiment of the present invention.

After forming the bridges 42, second isolation nitrides (layers) 44 are formed over portions of the bridges 42, as shown in FIG. 8. The second isolation nitrides 44 electrically isolate in the active area 17 the bridges 42, which preferably include polysilicon, from the subsequently formed cap layer, which is also preferably made of polysilicon. The second isolation nitrides 44 should be thick enough to not be entirely removed during the later performed release etch if they are etched at all. In one embodiment, the second isolation nitrides 44 are approximately 0.5 to 1 micron of low stress silicon rich silicon nitride formed by LPCVD. Other processes such as plasma enhanced chemical vapor deposition (PECVD), chemical vapor deposition (CVD), combinations of the above and LPCVD can be used. In one embodiment, the low stress silicon rich silicon nitride has a tensile stress less than approximately 200 MPa. Any known patterning process can be used.

Figure 9:
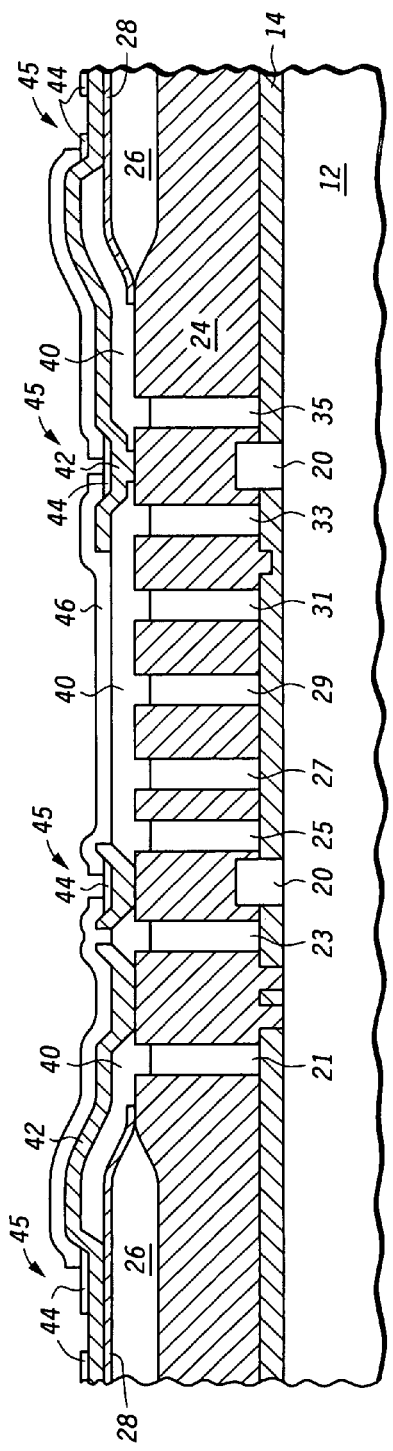
FIG. 9 illustrates the semiconductor device of FIG. 8 after forming a second sacrificial layer in accordance with an embodiment of the present invention.

After forming the second isolation nitrides 44, a second sacrificial layer 46 is formed over the semiconductor device 10, as shown in FIG. 9. The second sacrificial layer 46 defines the spacing of the accelerometer to the subsequently formed cap layer. The spacing should be large enough to reduce parasitic capacitance. In addition, the second sacrificial layer 46 forms both lateral and z-axis stops and exposes pillars 45 for supports for the (to be formed) cap layer. In one embodiment, the second sacrificial layer 46 is formed by PECVD, LPCVD, CVD, physical vapor deposition (PVD), the like, and combinations of the above. In one embodiment, the second sacrificial layer 46 is approximately 1-3 microns of PSG.

Also shown in FIG. 9, pillars 45 are formed by forming etch holes in the second sacrificial layer 46. The pillars 45 make the subsequently formed cap layer stronger. To determine the spacing of the pillars 45 the maximum pressure that will be exerted on the semiconductor device 10 should be used. Usually, the spacing of the pillars will be approximately 20 to 50 microns apart.

Figure 10:
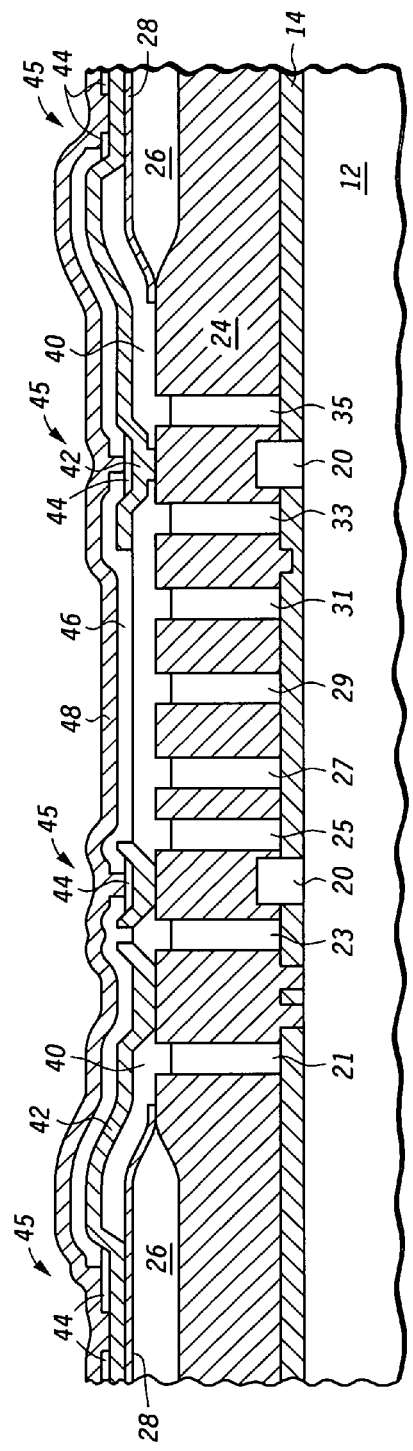
FIG. 10 illustrates the semiconductor device of FIG. 9 after forming a cap layer in accordance with an embodiment of the present invention.

Shown in FIG. 10, a cap layer 48 is formed over the semiconductor device 10 and the second sacrificial layer 46. The cap layer 48 is formed over the pillars 45, which will become the mechanical support for the cap layer 48 after the release etch, which will remove the first and second sacrificial layers 40 and 46 and BOX layer 14. The cap layer 48 should be thick enough and the density of the pillars 45 should be great enough so that the cap layer 48 can withstand pressures of generated when the semiconductor device 10 is packaged, for example by plastic molding. For plastic molding, such pressures are approximately 1000 psi. In one embodiment, the cap layer 48 is approximately 2 to 10 microns of polysilicon formed by LPCVD or an epitaxial process. The polysilicon may be annealed after deposition to decrease stress in the material. Other materials such as germanium and any metal can be used instead of or in conjunction with polysilicon. Generally, any material with suitable mechanical strength and that is compatible with CMOS processing can be used.

Figure 11:
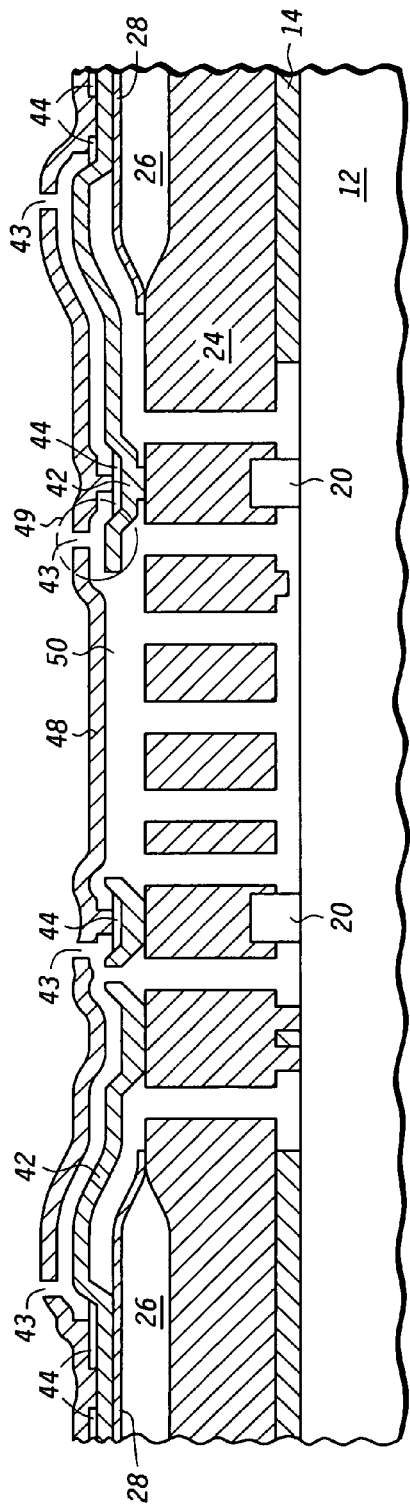
FIG. 11 illustrates the semiconductor device of FIG. 10 after performing an etch to remove portions of the cap layer to form holes in accordance with an embodiment of the present invention.

After forming the cap layer 48, holes (i.e., openings) 43 are etched in the cap layer 48, as shown in FIG. 11. Any conventional etch process can be used. The holes 43 are used to allow the chemicals used in the release etch to reach the first 40 and second 46 sacrificial layers and the BOX layer 14 so that at least portions of these layers are removed to release the semiconductor device 10.

The release etch is performed to release the seismic mass 32 by removing the first 40 and the second 46 sacrificial layers and a portion of the BOX layer 14 and forming a gap 50, as shown in FIG. 11. It may be desirable to perform an overetch to account for variations across a wafer to ensure complete removal of the first 40 and the second 46 sacrificial layers and the portions of the BOX layer 14. The release etch chemistry chosen preferably minimizes the etching of the anchors 20 and the second isolation nitride 44. The resulting structure preferably has no stiction in the x, y and z directions between any moving and fixed parts. The release etch removes the first 40 and the second 46 sacrificial layers below the cap 48 and within the trenches 21, 23, 25, 27, 29, 31, 33 and 35. In addition, the BOX layer 14 is removed from below the trenches 21, 23, 25, 27, 29, 31, 33 and 35, the fixed electrodes 34, the suspension 30, the bulk contact 32, and the seismic mass 36. In other words, the BOX layer 14 is removed from at least the majority of the active area 17. In one embodiment, a hydrofluoric acid (HF) wet etch is used to remove the first 40 and second 46 sacrificial layers and portion of the BOX layer 14. Other processes such as a vapor phase HF etch can also be used. After the release etch, portions of the semiconductor device 10 is now free to move. However, the holes 43 of the cap layer 48 can allow particles and moisture to get into the accelometer and negatively affect the performance of the semiconductor device 10.

Figure 12:
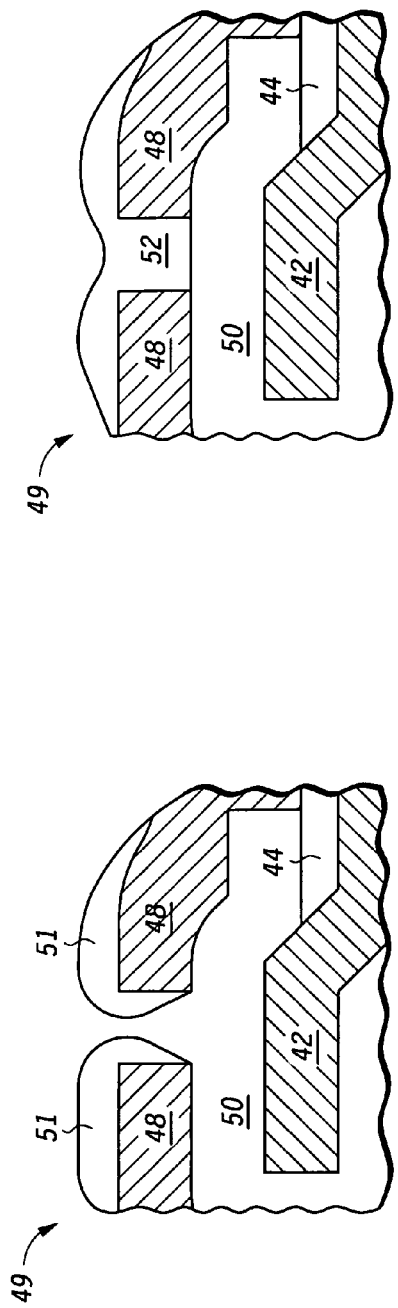
FIG. 12 illustrates a portion of FIG. 11 after forming a reflowable layer over a portion of the semiconductor device in accordance with one embodiment of the present invention.

In one embodiment, the holes 43 are sealed by forming a reflowable layer 51 over the semiconductor device 10, as shown in FIG. 12. The area enclosed in the circle 49 of FIG. 11 is shown in FIG. 12 after the reflowable layer 51 is formed. In the embodiment illustrated, the reflowable layer 51 can be deposited by PECVD, physical vapor deposition (PVD) or atmospheric CVD. (Atmospheric CVD is CVD at a pressure approximately equal to atmosphere.) The thickness of the reflowable layer 51 may depend on the etch port width and height and the thickness of the cap layer 48. In one embodiment, the cap layer 48 is approximately 2-4 microns in thickness. As illustrated in FIG. 12, the reflowable layer 51 does not seal the hole 43. Instead, the reflowable layer 51 is formed on the top surface of the cap layer 48 and the sidewalls of the hole 43. Thus, subsequent processing needs to occur so that the reflowable layer 51 seals the hole 43. In one embodiment, the reflowable layer 51 is PSG; any other suitable material may be used. In one embodiment, the reflowable layer 51 is approximately 3 microns of PSG. In one embodiment, the reflowable layer 51 is borophosphosilicate glass (BPSG).

When sealing the holes 43 it is desirable that the pressure within the gap 50 is at approximately atmospheric pressure to prevent oscillation of the accelerometer (i.e., the accelerometer is overdamped.) If instead, the gap 50 is at vacuum pressure oscillation will undesirably occur. Thus, if the process used to form the reflowable layer occurs at vacuum, which is the case for PECVD, the semiconductor device 10 at this point in processing is removed from the vacuum and put into an atmosphere which has a pressure approximately equal to atmospheric pressure for subsequent processing. In addition, the resulting seal should be hermetic and should not encroach the device area (i.e., the area underneath the cap layer 48).

Figure 13:
FIG. 13 illustrates the portion of the semiconductor device of FIG. 12 after a reflow process to form a seal layer in accordance with one embodiment of the present invention.
Figure 14:
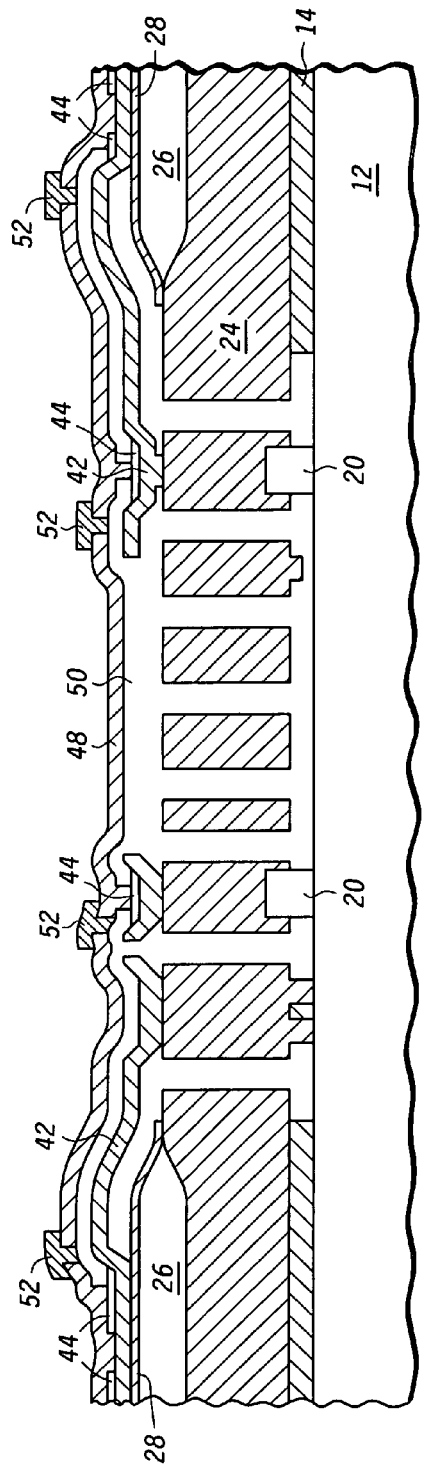
FIG. 14 illustrates the semiconductor device of FIG. 11 after forming a seal layer in accordance with an embodiment of the present invention.

To merge the disconnected portions of the reflowable layer 51 and seal the hole 43, the reflowable layer 51 is reflowed in a pressure approximately equal to atmosphere, in one embodiment using an anneal process. In one embodiment, the temperature is between approximately 1,000 and 1,040 degrees Celsius with approximately 4-8%, preferably approximately 6.5%, of phosphorus in the atmosphere, The topography of the semiconductor device 10 may alter the parameters used for the anneal. The anneal may occur on a global scale so that the entire semiconductor device 10 is exposed to the heat, such as by using a furnace. Instead, the anneal can occur on a local scale (i.e., localized annealing) so that only one area is exposed to the heat and not the entire semiconductor device 10. In this embodiment, a laser may be used. In one embodiment, phosphorus may be added to the atmosphere to decrease the temperature at which the anneal occurs; it is not necessary that phosphorus be present. Chemicals such as $POCl_3$ and $PH_3$ can be used in a furnace to introduce phosphorus into the atmosphere. After the reflow or annealing process the reflowable layer 51 has sealed the hole 43, made the pressure of the gap 50 approximately equal to atmospheric pressure and formed the seal layer 52, as shown in FIG. 13. In other words, the reflowable layer 51 has established the pressure in the gap 50 and the holes 43 at approximately atmospheric pressure and has closed the gap 50 and holes off to the environment. (Although the bottom portion of the seal layer 52 is contiguous with the bottom portion of the cap layer 48 this is not required and may not occur.) In other words, the accelerometer is now desirably overdamped. In one embodiment, the reflow or anneal process to form the seal layer 52 occurs in an $N_2$, $O_2$, or combination of the above environment at approximately 1000-1040 degrees Celsius. (A densification anneal process may be performed prior to the reflow anneal process at approximately 900-1000 degrees Celsius an $N_2$, $O_2$, or combination of the above environment. After the seal layer 52 is formed, the portions of the seal layer that are not over holes are optionally removed, as shown in FIG. 14. In one embodiment, the seal layer 52 is patterned using an RIE process with the cap layer 48 as an etch stop layer.

Alternatively, the reflow or anneal process may not be performed. If a process that can deposit the seal layer 52 at approximately atmospheric pressure to seal the hole 43 is used, then the reflow or anneal process is not needed. For example, atmospheric CVD may be used. However, to seal the hole 43 using atmospheric CVD a thicker seal layer 52 may need to be deposited so that reflowing is not needed. In one embodiment, reflow may occur using a high pressure oxidation furnace (HiPOX) furnace.

Figure 15:
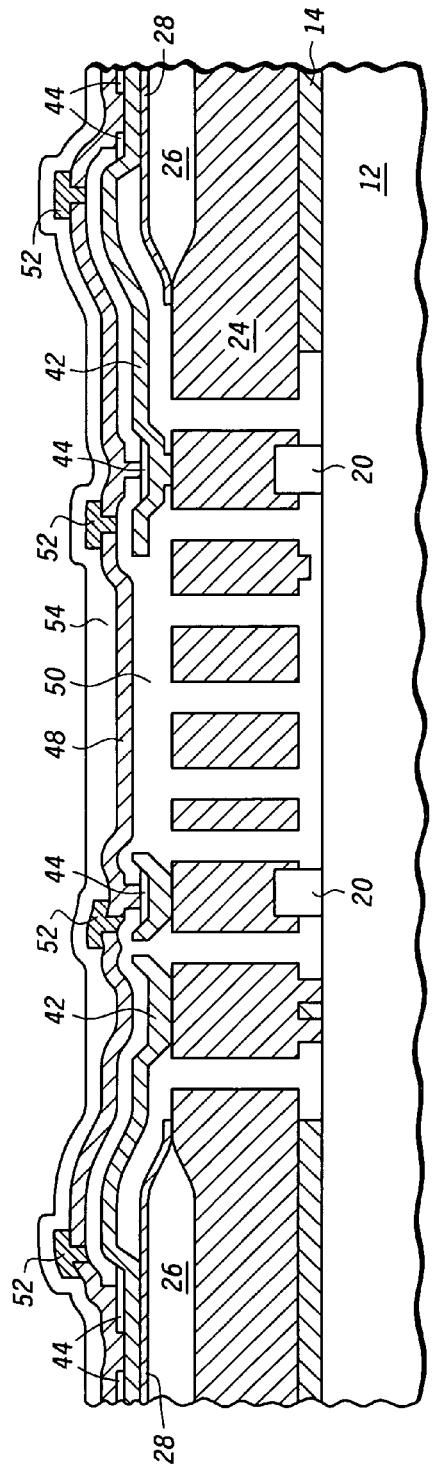
FIG. 15 illustrates the semiconductor device of FIG. 14 after forming a cap seal layer over the seal layer in accordance with an embodiment of the present invention.

After the seal layer 52 is formed, a cap seal layer 54, which may be one or more layers, is formed to hermetically encase the seal layer 52 over the holes 43, as shown in FIG. 15. It is desirable that the thickness of the cap seal layer 54 is be sufficient to prevent access of the seal layer 52 to the atmosphere, even in a high humidity and high temperature environment if the semiconductor device 10 will later be put in such an environment. The cap seal layer 54 can be any conductive material and preferably has a low stress and a low contact resistance to the cap layer 48. In one embodiment, cap seal has a stress less than approximately 100 MPa and a contact resistance less than approximately 20-40 Ohms/square. In one embodiment, the cap seal layer 54 is approximately 0.3 to 3 microns of polysilicon deposited using LPCVD. The polysilicon may be doped and subsequently annealed to decrease stress.

Figure 16:
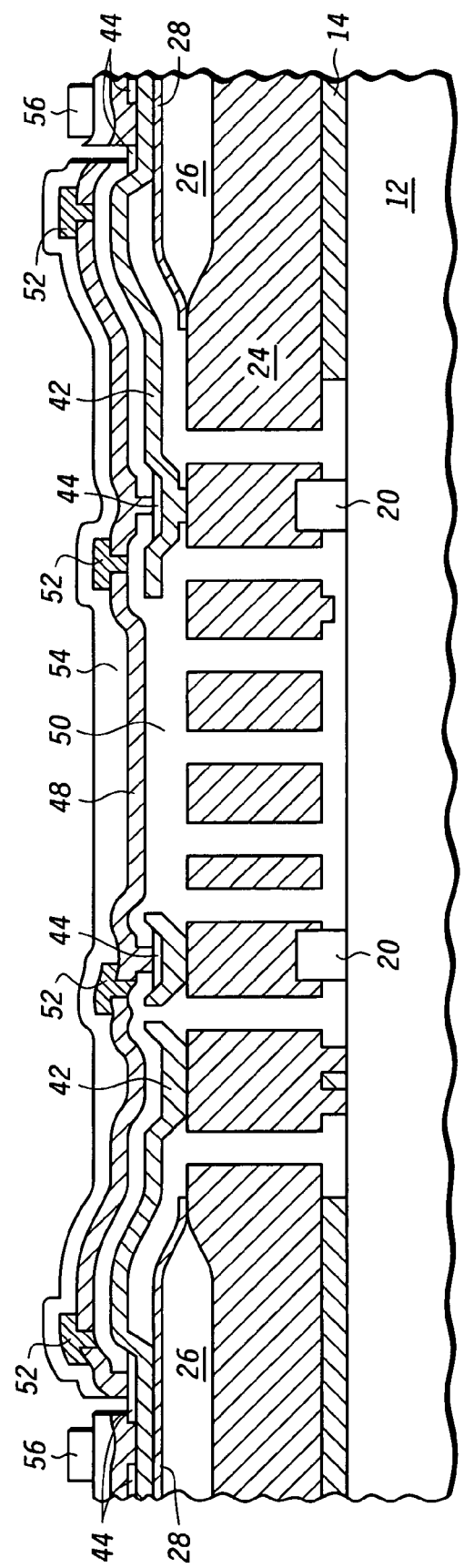
FIG. 16 illustrates the semiconductor device of FIG. 15 after forming bond pads in accordance with an embodiment of the present invention.

As shown in FIG. 16, after forming the cap seal layer 54, bond pads 56 are formed. It is desirable that the bond pads form a good metal contact with the underlying materials (such as the cap seal layer 54), are suitable materials for good adhesion for wirebonds or other electrical connections formed during packaging processes, and have a clean surface for subsequent processing. In one embodiment approximately 2 microns of Al/Si is sputtered over the semiconductor device 10 and an etch using the cap seal layer 54 as an etch stop layer is preformed to pattern the sputtered Al/Si layer and form the bond pads 56. After formation of the bond pads 56, an etch (using conventional processing) is performed to remove portions of the cap seal layer 54 and the cap layer 48 from the field areas 19. subsequent processing occurs to package the semiconductor device 10. Next, subsequent processing occurs to package the semiconductor device 10. Since such processing is known to a skilled artisan and may distract from the present invention such is not discussed herein.

By now it should be appreciated that there has been provided a process for forming a seal and cap seal uses a single wafer or substrate and seals the gap at approximately atmospheric pressure. Furthermore, the process uses an on-chip cap process. By doing so, the due size of the semiconductor device 10 is decreased compared to when a wafer is used as the cap. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

In the foregoing specification, the invention has been described with reference to specific embodiments. However, one of ordinary skill in the art appreciates that various modifications and changes can be made without departing from the scope of the present invention as set forth in the claims below. For example, the seal layer could be a solder ball (e.g., made of Pb/Sn) or any volume of material, for example, that is deposited over the openings and is later optionally reflowed to form the seal layer 52. In addition, as a skilled artisan should recognize although some materials were described above as being n-type, p-type materials could also be used. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "coupled", as used herein, is defined as connected, although not necessarily directly, and not necessarily mechanically.

What is claimed is:

1. A method for forming a semiconductor device comprising:
   providing a semiconductor substrate;
   forming a layer over the semiconductor substrate, wherein a gap is formed between the semiconductor substrate and the layer;
   forming an opening within the layer;
   forming an insulating layer over the layer at approximately atmospheric pressure to seal the opening and close the gap off to the environment, wherein forming the insulating layer comprises depositing the insulating layer and annealing the insulating layer at approximately atmospheric pressure;
   placing the semiconductor substrate into a vacuum environment before forming the insulating layer;
   removing the semiconductor substrate from the vacuum environment after forming the insulating layer, wherein forming the insulating layer further comprises depositing the insulating layer; and
   reflowing the insulating layer after removing the semiconductor substrate from the vacuum environment.

2. The method of claim 1, wherein depositing the insulating layer further comprises depositing the insulating layer at approximately atmospheric pressure.

3. The method of claim 2, wherein depositing is performed by chemical vapor deposition (CVD).

4. The method of claim 1, wherein annealing comprises a furnace anneal.

5. The method of claim 1, wherein annealing comprises a localized anneal.

6. The method of claim 1, wherein annealing further comprises annealing in a phosphorus atmosphere.

7. The method of claim 1, wherein annealing comprises using a laser.

8. The method of claim 1, wherein annealing comprises reflowing the insulating layer.

9. The method of claim 1, wherein forming the layer over the semiconductor substrate comprises forming a polysilicon layer.

10. The method of claim 1, wherein forming an insulating layer comprises forming a phosphosilicate glass (PSG).

11. A method for forming a semiconductor device comprising:
    providing a semiconductor substrate having a first set of extensions and an anchor;
    forming a layer coupled to the anchor and able to move relative to the substrate in at least one direction, wherein the layer has a second set of extensions, wherein the first set of extensions and the second set of extensions are interdigitated and form a set of gaps;
    placing the semiconductor substrate in a vacuum;
    forming an insulating layer over the set of gaps in the vacuum;
    removing the semiconductor substrate from the vacuum; and
    annealing the insulating layer to seal the set of gaps after removing the semiconductor substrate from the vacuum.

12. The method of claim 1, wherein forming the layer over the semiconductor substrate comprises forming a conductive layer.

13. The method of claim 11, forming the insulating layer further comprises depositing the insulating layer.

14. The method of claim 13, wherein depositing is performed by chemical vapor deposition (CVD).

15. The method of claim 13, wherein annealing comprises a furnace anneal.

16. The method of claim 13, wherein annealing comprises a localized anneal.

17. The method of claim 13, wherein annealing further comprises annealing in a phosphorus atmosphere.

18. The method of claim 13, wherein annealing comprises using a laser.

19. The method of claim 13, wherein annealing comprises reflowing the insulating layer.

20. The method of claim 1, wherein forming the layer comprises forming a polysilicon layer.

* * * * *